United States Patent
Tanaka et al.

(10) Patent No.: US 11,482,185 B2
(45) Date of Patent: Oct. 25, 2022

(54) METHOD FOR DRIVING DISPLAY DEVICE, AND DISPLAY DEVICE

(71) Applicant: Sharp Kabushiki Kaisha, Sakai (JP)

(72) Inventors: Yuta Tanaka, Sakai (JP); Kazuo Nakamura, Sakai (JP); Kazuki Takahashi, Sakai (JP); Jin Miyazawa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/635,970

(22) PCT Filed: Jul. 25, 2018

(86) PCT No.: PCT/JP2018/027860
§ 371 (c)(1),
(2) Date: Jan. 31, 2020

(87) PCT Pub. No.: WO2019/026723
PCT Pub. Date: Feb. 7, 2019

(65) Prior Publication Data
US 2020/0243035 A1    Jul. 30, 2020

(30) Foreign Application Priority Data

Aug. 1, 2017    (JP) .............................. JP2017-149025

(51) Int. Cl.
*G09G 3/36*    (2006.01)
*H01L 27/12*   (2006.01)

(52) U.S. Cl.
CPC ....... *G09G 3/3688* (2013.01); *H01L 27/1225* (2013.01); *G09G 2310/08* (2013.01); *G09G 2330/022* (2013.01)

(58) Field of Classification Search
CPC .......... G09G 3/3688; G09G 2320/043; G09G 3/3233; G09G 2310/08; G09G 3/3266; G09G 2300/0861; G09G 2330/021; G09G 2310/027; G09G 2310/061; G09G 3/3674; G09G 2310/0286; G09G 2320/0209; G09G 3/3275; G09G 3/3685; G09G 2310/0275;
(Continued)

(56) References Cited

U.S. PATENT DOCUMENTS 9,286,985 B2 *  3/2016  Kimura ................. G06F 1/3225
2003/0080951 A1  5/2003  Fujiwara et al.
(Continued)

FOREIGN PATENT DOCUMENTS

JP    2001-312253 A    11/2001
JP    2003-131632      5/2003
(Continued)

*Primary Examiner* — Duc Q Dinh
(74) *Attorney, Agent, or Firm* — ScienBiziP, P.C.

(57) ABSTRACT

A method for driving a display device capable of appropriately performing idle driving even when timing information is not transmitted to a liquid crystal module in advance is
(Continued)

provided. In a case where, in one vertical period, a non-scanning period other than a scanning period in which a screen of a display unit is scanned once is set to a pause period, a liquid crystal module delays supply of a data signal to the display unit by a recovery period during which a source driver is recovered from a sleep state to an active state in the pause period.

17 Claims, 9 Drawing Sheets

(58) Field of Classification Search
CPC ....... G09G 2310/0289; G09G 2330/02; G09G 2230/00; G09G 2310/0267; G09G 2310/066; G09G 2320/0223; G09G 2370/047; G09G 5/003; G09G 5/006; G09G 2310/0202; G09G 2330/06; G09G 2370/08; G06F 12/0207; G06F 12/0607; G06F 9/4494; G06F 13/1673; G06F 13/1689; G06F 1/1626; G06F 1/3215; G06F 1/3218; G06F 1/3265; G06F 1/3293; G06F 3/147; G06F 3/14; G06F 1/12; G06F 13/4295; G06F 1/3203; G06F 1/3206; G06F 3/061; G06F 9/4418; G06F 1/24
USPC .................................................... 345/76–102
See application file for complete search history.

(56) References Cited

U.S. PATENT DOCUMENTS

| | | | |
|---|---|---|---|
| 2014/0022231 A1* | 1/2014 | Saitoh .................. | G09G 3/3648 345/212 |
| 2016/0210919 A1* | 7/2016 | Nakanishi ............ | G09G 3/3648 |
| 2016/0321983 A1* | 11/2016 | Kim ..................... | H01L 27/3276 |
| 2016/0380006 A1* | 12/2016 | Uchida ............... | H01L 27/1255 257/43 |
| 2018/0007311 A1* | 1/2018 | Kato ........................ | G09G 5/36 |
| 2019/0094590 A1* | 3/2019 | Aoki ........................ | G09G 3/36 |

FOREIGN PATENT DOCUMENTS

| | | |
|---|---|---|
| KR | 10-2016-0081424 | 7/2016 |
| WO | 2012/137761 | 10/2012 |
| WO | 2016/111263 | 7/2016 |

* cited by examiner

METHOD FOR DRIVING DISPLAY DEVICE, AND DISPLAY DEVICE

TECHNICAL FIELD

The present invention relates to a method for driving a display device to achieve reduction in power consumption.

BACKGROUND ART

In a portable terminal such as a smartphone or a lap-top PC, an active matrix LCD constituting a display unit generally accounts for main power consumption. Thus, the power consumption of the active matrix LCD is required to be urgently reduced.

For example, as a technique for achieving reduction in the power consumption, idle driving that a pause period in which all scanning signal lines are brought into a non-scanning state is provided during a vertical blank period (non-scanning period) has been proposed. However, since the vertical blank period is normally short, a problem that even provision of the pause period does not lead to sufficient reduction in the power consumption is caused.

Then, PTLs 1 and 2 disclose a technique by which sufficient reduction in power consumption is achieved by providing, in one vertical period, the vertical blank period (pause period) that is longer than a write period, for example, as illustrated in FIG. 4.

Meanwhile, in conventional idle driving, in a case of an interface eDP by which a CPU/GPU and a liquid crystal module are connected, at a top of a previous frame, an MSA (Main Stream Attribute) signal that indicates a start timing of a next frame is transmitted to a ICON circuit (timing controller) on the liquid crystal module side from the CPU/GPU side. By using the MSA signal, a display timing on the liquid crystal module side is adjusted.

However, in a case where the CPU/GPU side transmits a video signal with a certain frequency irrespective of an image generation speed, the display timing on the liquid crystal module side is able to be appropriately set by using the MSA signal. On the other hand, in a case where the CPU/GPU side transmits a video signal with a frequency that varies for every frame in accordance with the image generation speed, accurate timing information is difficult to be received by using the MSA signal, thus causing a problem that deviation of the display timing occurs between the CPU/GPU side and the liquid crystal module side and display quality is considerably deteriorated.

Accordingly, in a case where the image generation speed of the CPU/GPU varies depending on an image and the video signal with a frequency that varies for every frame is transmitted, for example, as illustrated in FIG. 5, by changing a refresh rate (vertical period) on the liquid crystal module side in accordance with the image generation speed, deviation of the display timing on the liquid crystal module side does not occur. In this case, driving is started in accordance with video data (also including a case where an immediately preceding BE (Blank end) signal is input) input to the liquid crystal module instead of using the MSA signal described above.

CITATION LIST

Patent Literature

PTL 1: Japanese Unexamined Patent Application Publication No. 2001-312253 (published on Nov. 9, 2001)
PTL 2: Japanese Unexamined Patent Application Publication No. 2003-131632 (published on May 9, 2003)

SUMMARY OF INVENTION

Technical Problem

However, in both a case where the image generation speed of the CPU/GPU is constant and the refresh rate on the liquid crystal module side is fixed and a case where the image generation speed of the CPU/GPU varies depending on an image and the refresh rate (vertical period) on the liquid crystal module side is changed in accordance with the image generation speed, when idle driving is adopted, it is necessary to transmit timing information to the liquid crystal module in advance.

Accordingly, a problem that the idle driving is difficult to be appropriately performed unless the timing information such as an MSA signal is transmitted to the liquid crystal module in advance is caused.

The invention is made in view of the aforementioned problems and an object thereof is to achieve a method for driving a display device capable of appropriately performing idle driving even in a case where timing information is not transmitted to a liquid crystal module in advance.

Solution to Problem

In order to solve the aforementioned problems, a method for driving a display device according to an aspect of the invention is a method for driving a display device that performs display by line-sequentially selecting and scanning each of lines of a screen, which includes pixels arranged in a matrix form, with a plurality of scanning signal lines and supplying a data signal to a pixel of the selected line from a data signal line, in which, in a case where, in one vertical period, a non-scanning period other than a scanning period in which the screen is scanned once is set to a pause period, by a recovery period during which a data signal line driving circuit that drives the data signal line is recovered from a sleep state to an active state where the data signal is able to be supplied to the data signal line in the pause period, supply of display data to the data signal line driving circuit is delayed.

Advantageous Effects of Invention

According to an aspect of the invention, an effect that enables to appropriately perform idle driving even in a case where timing information is not transmitted to a liquid crystal module in advance is exerted.

DESCRIPTION OF EMBODIMENTS

Embodiment 1

An embodiment of the invention will be described as follows. Note that, in the present embodiment, first, a technique to be a premise of the invention will be described, and next, a specific example to which a principle of the invention is applied will be described. Moreover, in the present embodiment and other Embodiments 2 and 3, an example of an active matrix LCD will be described as a display device of the invention.

(Technique to be Premise of the Invention)

Figure 4:
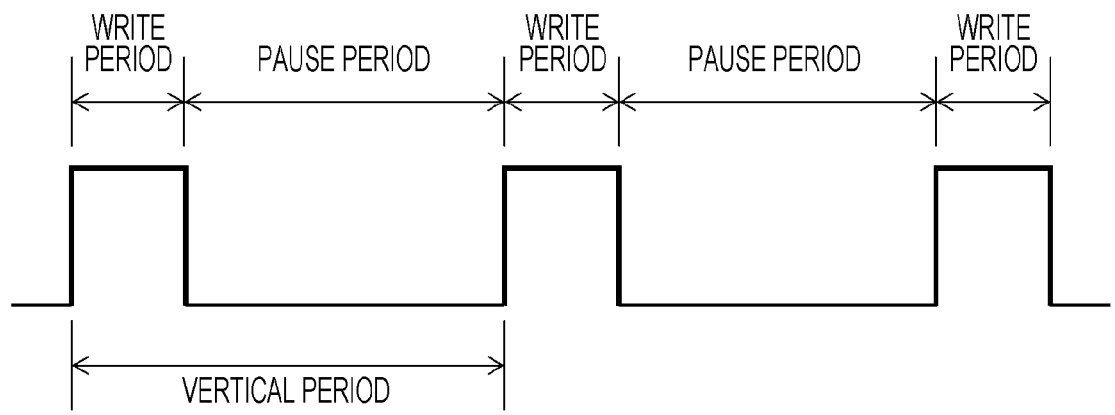
FIG. 4 is an explanatory view for explaining idle driving when a refresh rate is fixed.
Figure 5:
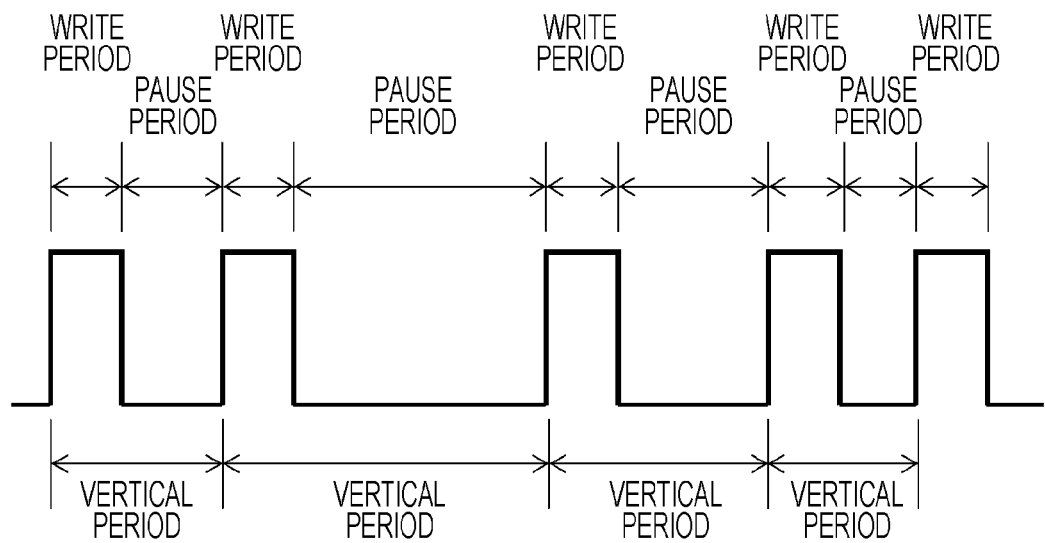
FIG. 5 is an explanation view for explaining idle driving when the refresh rate is not fixed (idle driving that is applied to Adaptive Sync).
Figure 6:
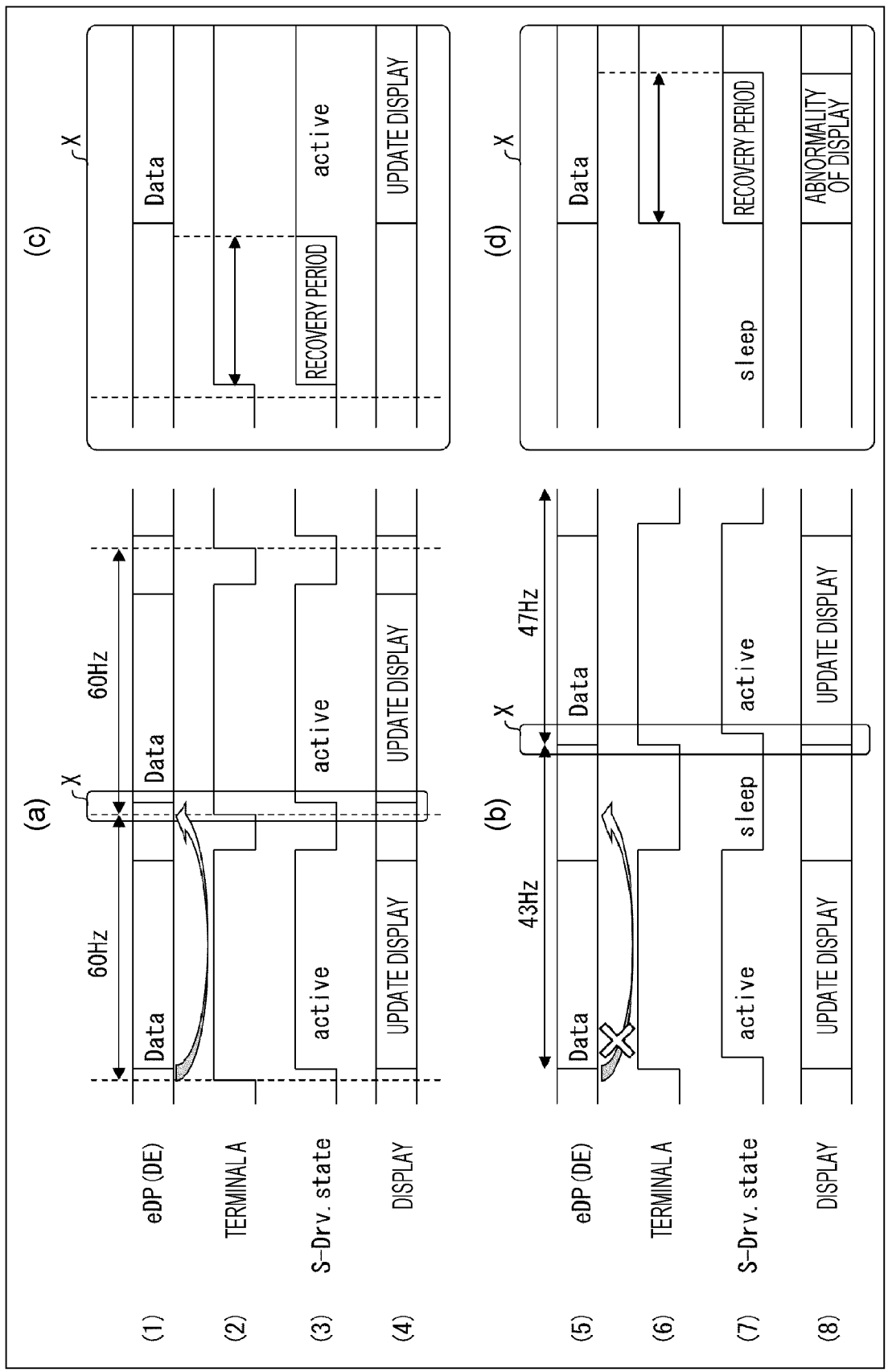
FIG. 6 is a timing chart in the idle driving illustrated in FIGS. 4 and 5.

The technique to be the premise of the invention will be described below with reference to FIGS. 4 to 6. FIG. 4 is an explanatory view for explaining idle driving when a refresh rate is fixed. FIG. 5 is an explanation view for explaining idle driving when the refresh rate is not fixed (frequency-variable driving such as Adaptive Sync). FIG. 6 is a timing chart in the idle driving, in which FIG. 6(*a*) is a timing chart of the idle driving illustrated in FIG. 4, FIG. 6(*b*) is a timing chart of the idle driving illustrated in FIG. 5, FIG. 6(*c*) is an enlarged view of a main part of FIG. 6(*a*), and FIG. 6(*d*) is an enlarged view of a main part of FIG. 6(*b*).

The idle driving is a technique by which power consumption is suppressed during a blank period in driving of an LCD. That is, in the idle driving, as illustrated in FIG. 4, a pause period which is a non-scanning period longer than a scanning period (write period) when a screen of an LCD panel is scanned once and in which all scanning signal lines are brought into a non-scanning state is provided and a sum of the scanning period and the pause period is set to one vertical period (blank period).

In a case of an LCD system using a ICON (timing controller), a sleep timing of an S-Drv. (source driver) is controlled by High/Low of a terminal A between the ICON and the S-Drv. In a case where the terminal A is at the Low, the S-Drv. is shifted from an active state to a sleep state, and in a case where the terminal A is at the High, the S-Drv. is shifted from the sleep state to the active state.

Accordingly, in the idle driving, it is possible to suppress power consumption by setting the terminal A to the Low (sleep state) in a vertical blank period (Vblank period) of a liquid crystal module. Note that, the S-Drv. requires a time to be recovered from the sleep state to the active state, so that it is necessary to set the terminal A to the High several lines before a first line in an active period.

As an interface by which the liquid crystal panel/module and a CPU/GPU board are connected, an eDP (embedded Display Port) is used.

In the eDP, in a case of idle driving when the refresh rate is fixed, as illustrated in FIG. 6(*a*), an MSA (Main Stream Attribute) signal is transmitted from the CPU/GPU side that generates display data one frame before a current frame. The MSA signal includes start timing information of a first line of the current frame, and the liquid crystal module is able to shift the terminal A to the High several lines before start of the frame by using the timing information, as illustrated in FIG. 6(*c*).

On the other hand, in the eDP, in a case of idle driving when the refresh rate is not fixed, that is, in a case of idle driving applied to the frequency-variable driving such as Adaptive Sync, since a timing when the CPU/GPU side ends image generation is unknown at a point one frame before the current frame, as illustrated in FIG. 6(*b*), a timing of the first line of the current frame is not able to be transmitted to the liquid crystal module by using the MSA signal. Thus, the start timing of the frame becomes unclear and the liquid crystal module side is not able to know the start of the frame until display data (DATA) of the frame is transmitted. Accordingly, since the terminal A is set to the High in accordance with an input of the display data as illustrated in FIG. 6(*d*), the S-Drv. does not recover in time and abnormality of display occurs.

Then, in the present embodiment, when the display data is input to a ICON circuit, the S-Drv. is recovered by setting the terminal A to the High, and an output of the display data to the S-Drv. is delayed by a time required for the recovery. Accordingly, the display data is output at the same time as the recovery of the S-Drv., and therefore, the abnormality of display does not occur. Hereinafter, an outline of a liquid crystal module using a line buffer as means by which the output of the display data is delayed will be described.

(Outline of Liquid Crystal Module)

Figure 1:
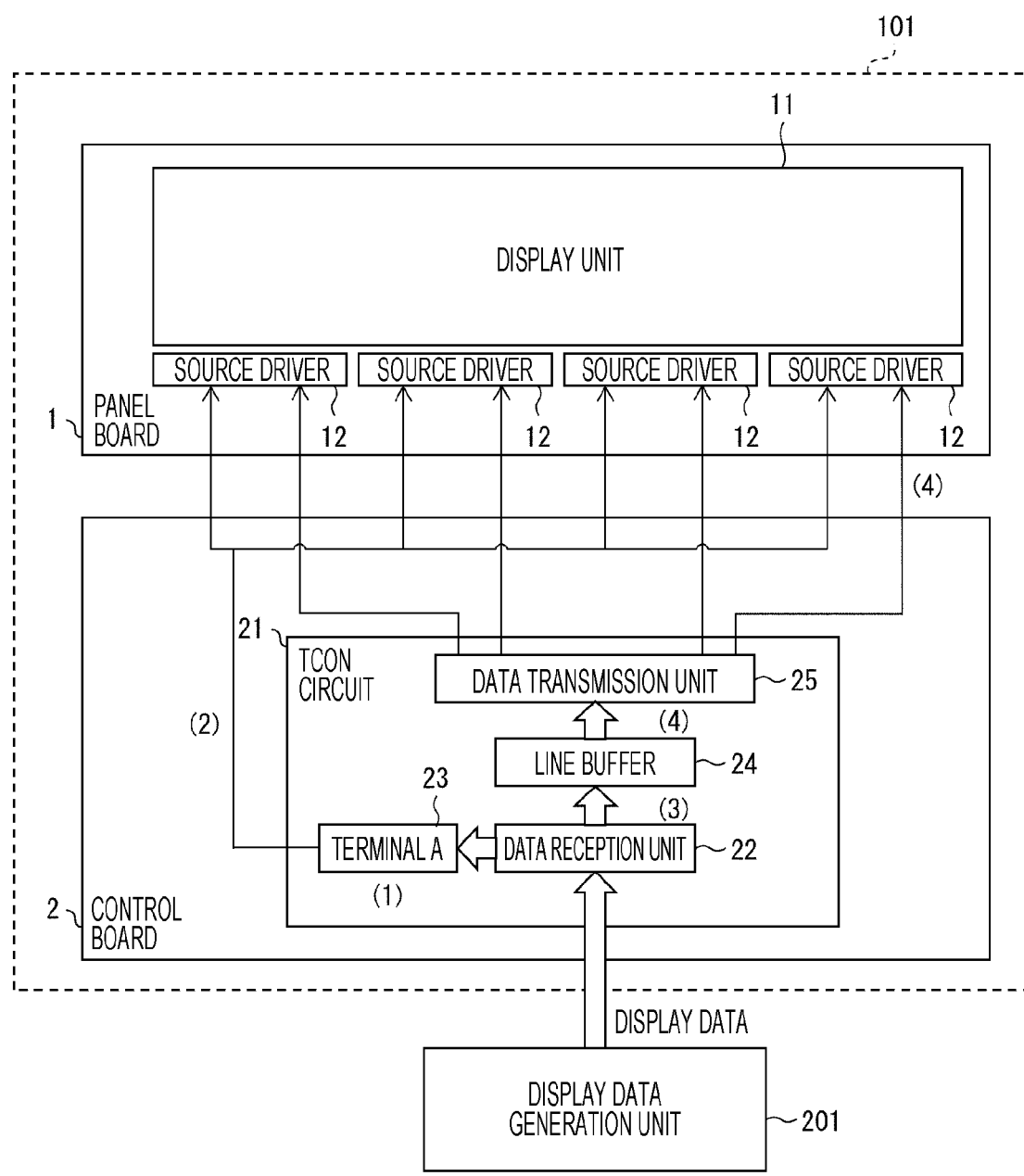
FIG. 1 is a block diagram of a schematic configuration of a liquid crystal module according to Embodiment 1 of the invention.

FIG. 1 is a block diagram of a schematic configuration of a liquid crystal module 101 according to the present embodiment.

The liquid crystal module 101 is one of components constituting an active matrix LCD (liquid crystal display) that is a type of a liquid crystal display device, and, as illustrated in FIG. 1, includes a panel board 1 and a control board 2, and displays display data generated by a display data generation unit 201 that is constituted by a CPU/GPU (graphic processing unit).

Note that, in the present embodiment, as an interface between the liquid crystal module 101 and the display data generation unit 201, an eDP (embedded display port) is adopted.

The panel board 1 includes a display unit 11 that is composed of a liquid crystal panel constituting a screen, which includes pixels arranged in a matrix form, and a plurality of source drivers (S-Drvs.) 12 and gate drivers (not illustrated) by which the display unit 11 is driven. That is, the display unit 11 displays an image by line-sequentially selecting and scanning lines (data signal lines) of the screen with a plurality of scanning signal lines by the gate drivers and supplying a data signal to a pixel of a selected line from the data signal line by the source drivers 12. Here, in the present embodiment, as a TFT that is a switching element included in the display unit 11, a TFT using an oxide semiconductor as a semiconductor layer is adopted. An example of the oxide semiconductor includes IGZO (InGaZnOx: registered trademark) that is an In—Ga—Zn—O-based oxide semiconductor.

The source driver 12 is driven and controlled by a control signal from the control board 2. That is, when a signal at a High level is transmitted from the control board 2, the source driver 12 is brought into the active state, and when a signal at a Low level is transmitted, the source driver 12 is brought into the sleep state.

The control board 2 includes a TCON circuit 21, and when display data generated by the display data generation unit 201 is transmitted, the TCON circuit 21 transmits the control signal and the display data to the source driver 12 of the panel board 1.

Specifically, the control signal and the display data are transmitted to the source driver 12 of the panel board 1 by a data reception unit 22, a terminal A 23, a line buffer 24, and a data transmission unit 25 in the TCON circuit 21.

That is, the data reception unit 22 receives the display data generated by the display data generation unit 201 via the eDP interface, and at a timing of the reception, shifts the terminal A 23 to a High level and transmits the received display data to the line buffer 24.

The line buffer 24 accumulates the display data for a preset number of lines and then the display data is transmitted to the source driver 12 of the panel board 1 via the data transmission unit 25.

The source driver 12 connected to the terminal A 23 is shifted to the active state when the terminal A 23 is shifted to the High level, before the display data is transmitted from the data transmission unit 25 to the source driver 12.

That is, since the terminal A 23 is at the Low level until the data reception unit 22 receives the display data, the source driver 12 is also in the sleep state. Then, at the timing when the data reception unit 22 receives the display data, the terminal A 23 is shifted from the Low level to the High level, and thus the source driver 12 is also shifted from the sleep state to the active state.

(Driving Method)

A method for driving the liquid crystal module 101 will be described below.

Figure 2:
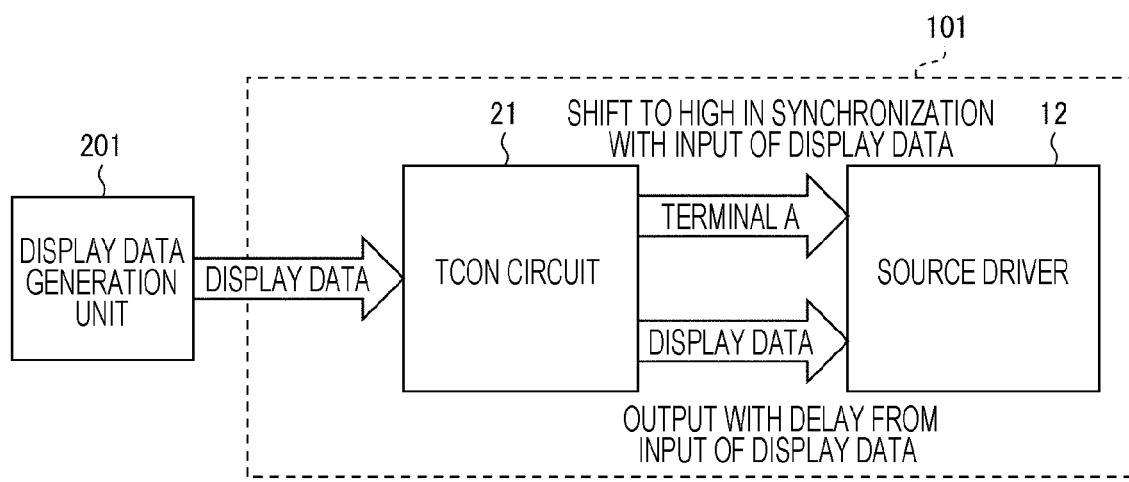
FIG. 2 is an explanatory view for explaining an outline of a method for driving the liquid crystal module illustrated in FIG. 1.

FIG. 2 is an explanatory view for explaining an outline of the method for driving the liquid crystal module 101.

In the liquid crystal module 101, in synchronization with an input of display data from the display data generation unit 201 to the ICON circuit 21, the terminal A 23 in the ICON circuit 21 is shifted to the High level as illustrated in FIG. 2, in the pause period. Thereby, the source driver 12 connected to the terminal A 23 starts to be shifted to the active state. On the other hand, the display data input to the TCON circuit 21 is accumulated for the preset number of lines in the line buffer 24, and then transmitted to the source driver 12. Thereby, the display data is transmitted to the source driver 12 after the transmission is delayed by the preset number of lines from the time when the source driver 12 starts to be shifted to the active state.

Here, it is preferable that the display data is transmitted to the source driver 12 by being delayed by a time taken for the source driver 12 to be completely in the active state after starting to be shifted to the active state, that is, a time (hereinafter, referred to as a recovery time) taken to recovery. Accordingly, the number of lines of the display data to be accumulated in the line buffer 24 may be set to a number allowing delay by a time corresponding to the recovery time. Since the recovery time of the source driver 12 is a time that is able to be known in advance, the number of lines of the display data to be accumulated in the line buffer 24 may be set in accordance with the source driver 12 that is used.

Example

Figure 3:
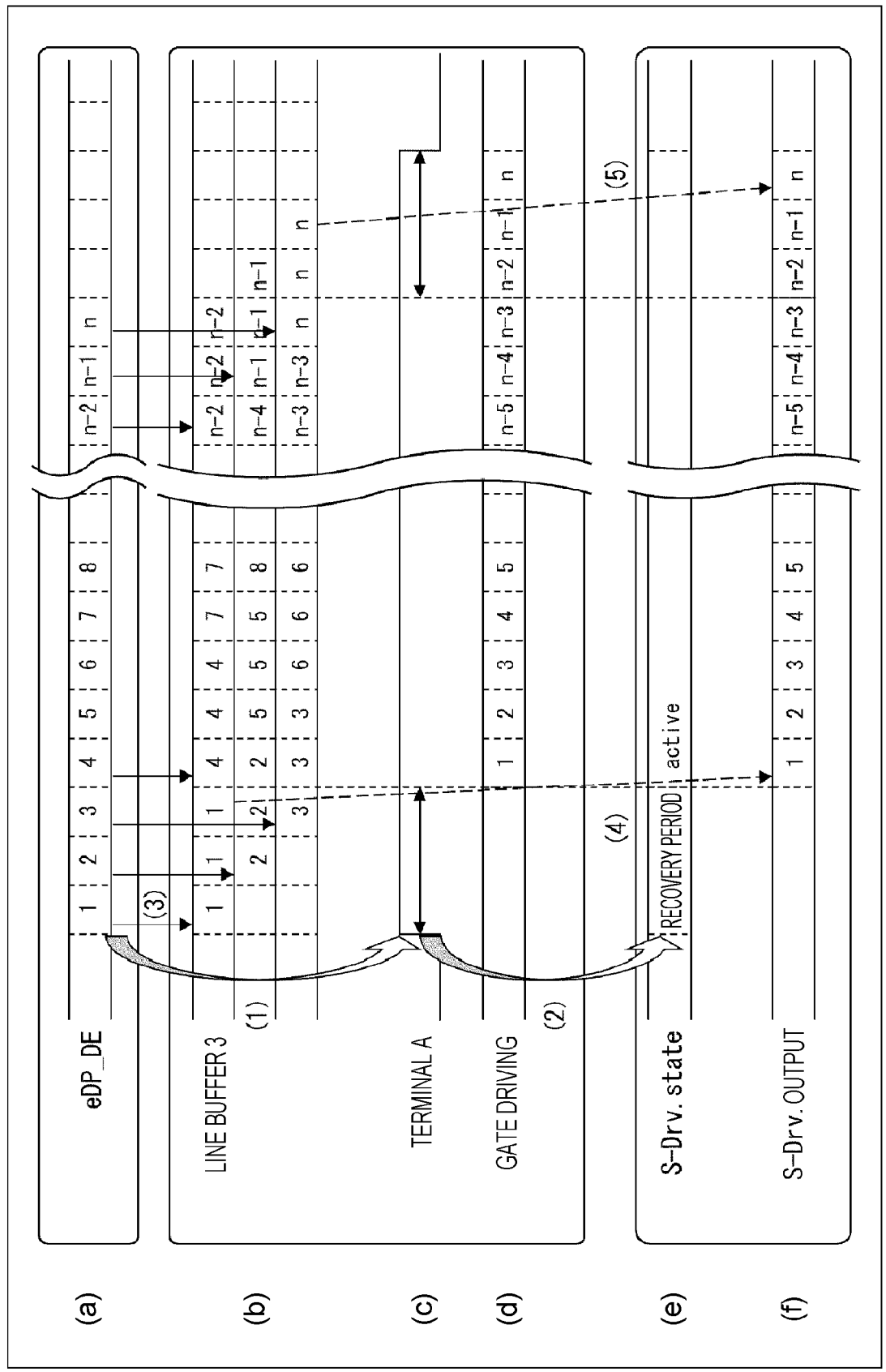
FIG. 3 is a timing chart for explaining the method for driving the liquid crystal module illustrated in FIG. 1.

FIG. 3 is a timing chart for explaining a driving method in which the number of lines of display data to be accumulated in the line buffer 24 is set to 3.

FIG. 3(*a*) illustrates display data (eDP_DE) from the display data generation unit 201, FIG. 3(*b*) illustrates the display data for three lines, which is accumulated in the line buffer 24, FIG. 3(*c*) illustrates a state (High level/Low level) of the terminal A 23, FIG. 3(*d*) illustrates display data to be subjected to gate driving, that is, first display data after accumulation for the three lines, FIG. 3(*e*) illustrates a state (S-Drv. state) of the source driver 12, and FIG. 3(*f*) illustrates data (S-Drv. output) output from the source driver 12.

Note that, (1) to (5) described in FIG. 3 respectively correspond to the following descriptions (1) to (5).

(1) In the pause period, in synchronization with an input of the display data (eDP_DE) from the display data generation unit 201 to the ICON circuit 21, the terminal A 23 in the ICON circuit 21 is shifted to the High level.

(2) When the terminal A 23 is shifted to the High level, recovery of the source driver 12 connected to the terminal A 23 starts. However, it takes a certain time to complete recovery after the start of the recovery.

(3) When the display data (eDP_DE) from the display data generation unit 201 is input to the ICON circuit 21, the display data for three lines is stored in the line buffer 24.

(4) At a timing when the display data for the three lines is stored in the line buffer 24, the state (S-Drv. state) of the source driver 12 is completely recovered so as to be the active state, and the display data is transmitted to the source driver 12. The source driver 12 outputs the transmitted display data to the display unit 11. Gate driving also starts in synchronization with an output operation of the source driver 12.

(5) While the transmission of the display data is delayed for the number or more of lines, the High level of the terminal A 23 is maintained. That is, by at least an amount of the delay, the period of the terminal A 23 in the High level is extended. Consequently, the active period of the source driver 12 is extended.

Note that, in order to secure the recovery time taken for the source driver 12 to be completely recovered after the start of the recovery, the number of lines in the line buffer 24 may not be the same as the number of lines to be delayed. For example, only three lines may be delayed with respect to an 8-line buffer storing display data for eight lines.

According to the aforementioned driving method, the recovery of the source driver 12 starts at the timing when the display data is input to the ICON circuit 21. In other words, the display data is delayed so that the display data is input after the source driver 12 is completely recovered, and the display data is output to the display unit 11.

In this manner, in the driving method according to the present embodiment, a signal (such as an MSA signal) by which a timing of outputting display data from the source driver 12 to the display unit 11 is adjusted is not required to be separately prepared.

Accordingly, since deviation of a display timing on the liquid crystal module 101 side does not occur, display quality is not deteriorated. Moreover, since the idle driving is performed in the liquid crystal module 101, reduction in power consumption is also achieved.

Note that, the example in which the line buffer 24 is used to secure the recovery time for the source driver 12 has been described in the present embodiment, but an example in which a frame buffer is used instead of the line buffer 24 will be described in an embodiment described below.

Embodiment 2

Another embodiment of the invention will be described as follows. Note that, for convenience of description, a member having the same function as that of the member described in the aforementioned embodiment will be given the same reference sign and description thereof will be omitted.

(Outline of Liquid Crystal Module)

Figure 7:
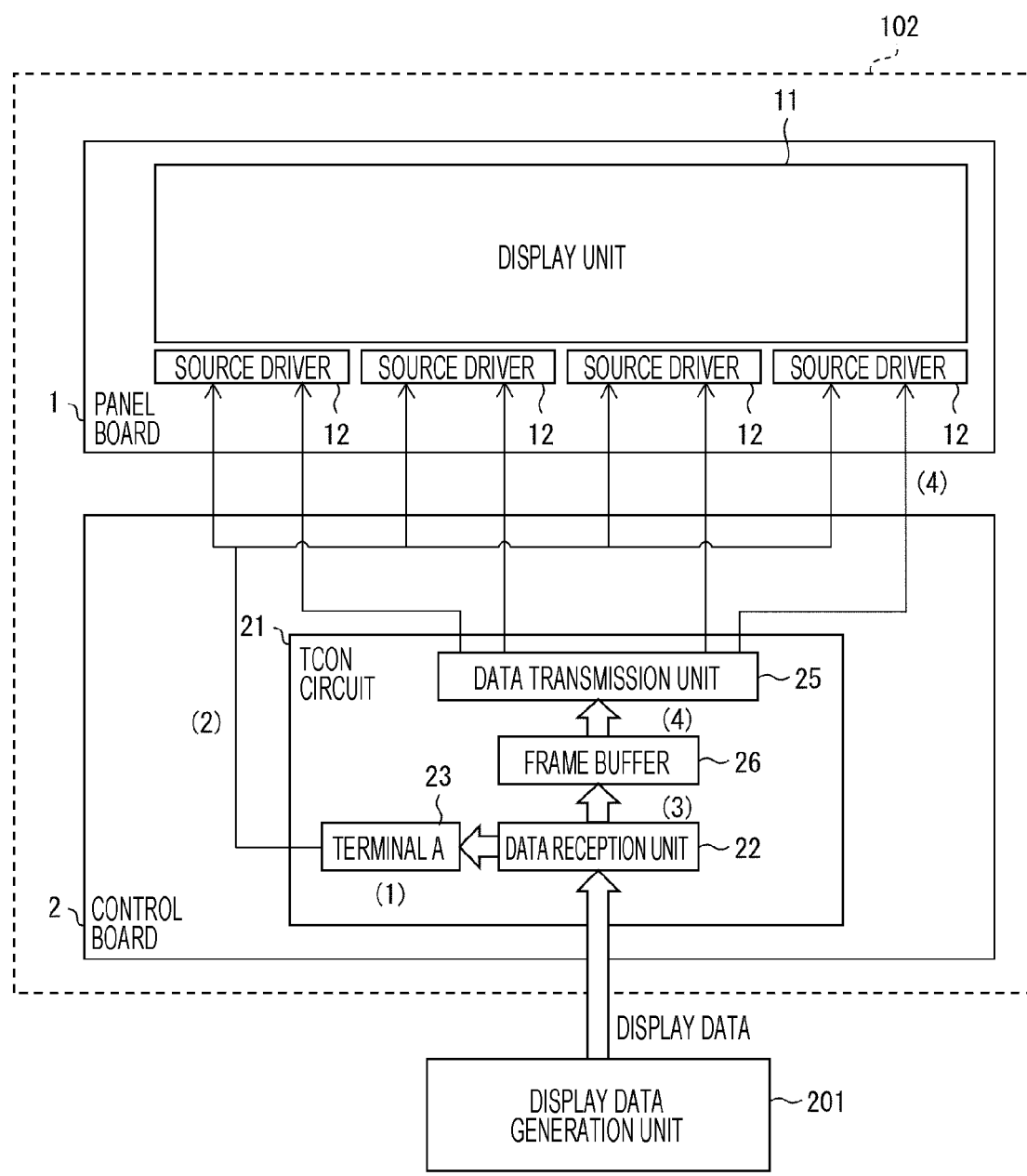
FIG. 7 is a block diagram of a schematic configuration of a liquid crystal module according to Embodiment 2 of the invention.

FIG. 7 is a block diagram of a schematic configuration of a liquid crystal module 102 according to the present embodiment.

As illustrated in FIG. 7, the liquid crystal module 102 has almost the same configuration as that of liquid crystal module 101 of Embodiment 1 described above and a difference lies in that the line buffer 24 of the liquid crystal display 101 of Embodiment 1 described above is changed to a frame buffer 26. That is, in Embodiment 1 described above, delay of display data is performed by accumulating the display data for each line, but in the present embodiment, delay of display data is performed by accumulating the display data for one frame.

At a timing when display data from the display data generation unit 201 is input to the ICON circuit 21, the frame buffer 26 saves the display data for one frame, and the display data saved in the frame buffer 26 is output from a first line after being delayed by a preset number of lines.

Example

Figure 8:
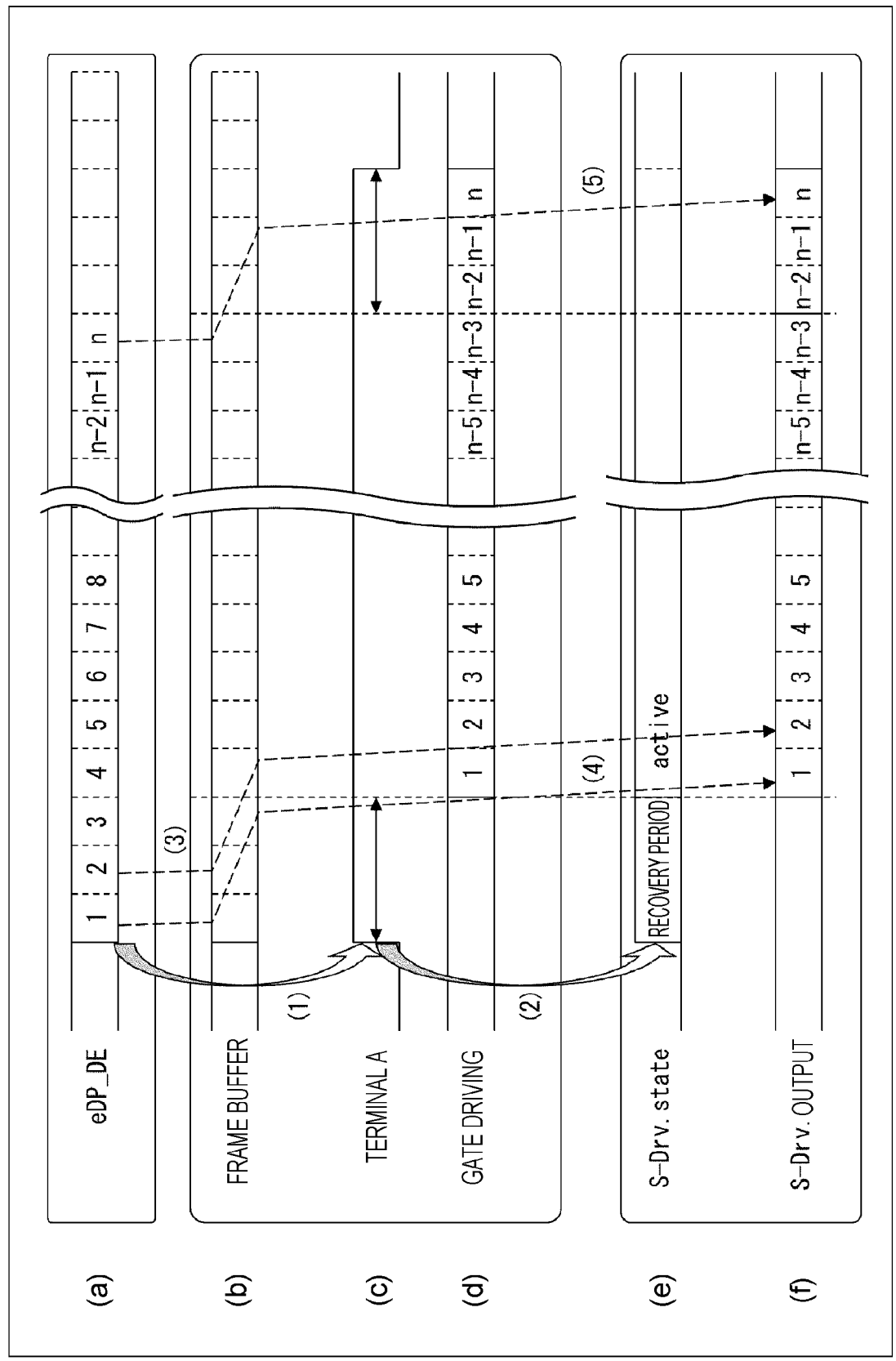
FIG. 8 is a timing chart for explaining a method for driving the liquid crystal module illustrated in FIG. 7.

FIG. 8 is a timing chart for explaining a driving method by which display data saved in the frame buffer 26 is output from a first line after being delayed by three lines. Note that, in the timing chart illustrated in FIG. 8, only FIG. 8(*b*) is different from that of the timing chart illustrated in FIG. 3 of Embodiment 1 described above. Moreover, similarly to Embodiment 1 described above, (1) to (5) described in FIG. 8 respectively correspond to the following description (1) to (5).

(1) In the pause period, in synchronization with an input of the display data (eDP_DE) from the display data generation unit 201 to the ICON circuit 21, the terminal A 23 in the ICON circuit 21 is shifted to the High level.

(2) When the terminal A 23 is shifted to the High level, recovery of the source driver 12 connected to the terminal A 23 starts. However, it takes a certain time to recover completely after start of the recovery.

(3) When the display data (eDP_DE) from the display data generation unit 201 is input to the ICON circuit 21, the display data for one frame is saved in the frame buffer 26.

(4) At a timing when delay is performed by three lines from the display data for one frame saved in the frame buffer 26, the state (S-Drv. state) of the source driver 12 is completely recovered so as to be the active state, and the display data is transmitted to the source driver 12. The source driver 12 outputs the transmitted display data to the display unit 11. Gate driving also starts in synchronization with an output operation of the source driver 12.

(5) While the transmission of the display data is delayed for the number or more of lines, the High level of the terminal A 23 is maintained. That is, by at least an amount of the delay, the High level of the terminal A 23 is extended. Consequently, the active period of the source driver 12 is extended.

According to the aforementioned driving method, though the recovery of the source driver 12 starts at the timing when the display data is input to the ICON circuit 21, the display data is delayed so that the display data is input after the source driver 12 is completely recovered and the display data is output to the display unit 11.

In this manner, in a case where the frame buffer 26 is used as means by which output of display data is delayed, it is possible to save the display data for one frame (display data of a first line to a final line). Accordingly, when writing of the display data for one frame is finished and there is a change to a next frame, data of the frame buffer 26 is updated from a first line again. Thus, in the present embodiment, it is set that the display data of the frame buffer 26 is output from a first line after a time corresponding to any number of delay lines (three lines in the example) is elapsed.

As above, in the driving method according to the present embodiment, similarly to Embodiment 1 described above, a signal (such as an MSA signal) by which a timing of outputting display data from the source driver 12 to the display unit 11 is adjusted is not required to be separately prepared.

Accordingly, since deviation of a display timing on the liquid crystal module 102 side does not occur, display quality is not deteriorated. Moreover, since the idle driving is performed in the liquid crystal module 102, reduction in power consumption is also achieved.

As above, in the present embodiment, the frame buffer 26 is used instead of the line buffer 24 of Embodiment 1 described above as means by which output of display data is delayed. In this manner, in a case where a frame buffer whose power consumption is larger than that of a line buffer is mounted instead of mounting the line buffer, as indicated below, it is possible to consequently reduce cost of an entire device. There is a function of PSR (panel self refresh) in the specification of the eDP interface of ver. 1.3 and thereafter. This function is a function of, when the same video data continues for several frames, outputting a video from a frame buffer of a liquid crystal module instead of stopping an output of an eDP interface, and is used as a function for reduction in power consumption. Because of such a function, a liquid crystal module for a lap-top PC has many models mounted with a frame buffer, so that an effect that a new buffer may not be mounted to achieve the invention is exerted.

In Embodiments 1 and 2 described above, the example in which the panel board 1 and the control board 2 are formed of separate bodies, that is, the source driver 12 and the ICON circuit 21 are formed on separate boards has been described, but in Embodiment 3 described below, an example in which a system driver in which a function of the ICON circuit is incorporated in a source driver will be described.

Embodiment 3

Still another embodiment of the invention will be described as follows. Note that, for convenience of description, a member having the same function as that of the member described in the aforementioned embodiments will be given the same reference sign and description thereof will be omitted.

(Outline of Liquid Crystal Module)

Figure 9:
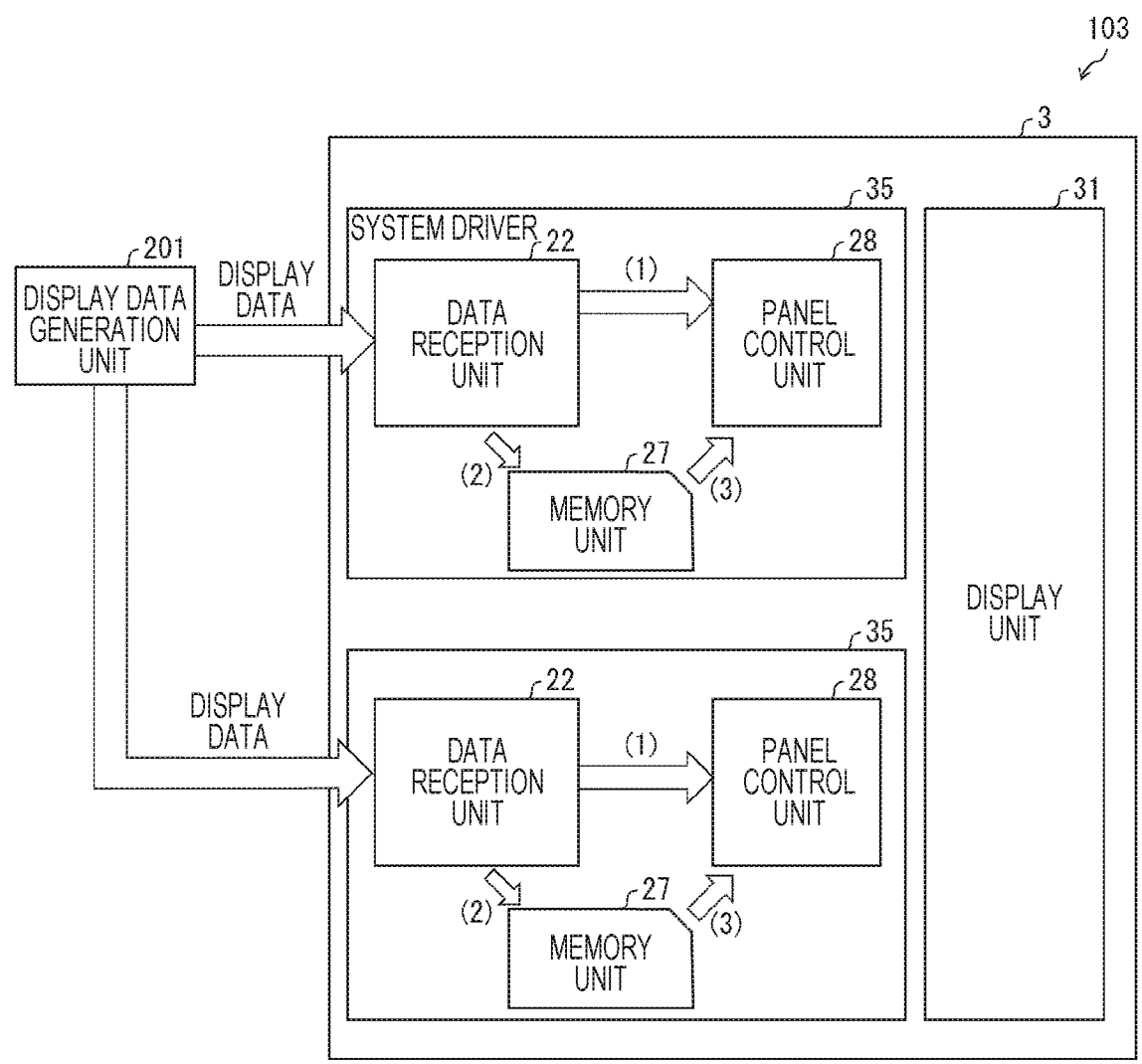
FIG. 9 is a block diagram of a schematic configuration of a liquid crystal module according to Embodiment 3 of the invention.

FIG. 9 is a block diagram of a schematic configuration of a liquid crystal module 103 according to the present embodiment.

As illustrated in FIG. 9, the liquid crystal module 103 has a configuration in which a display unit 31 and a plurality of system drivers 35 are provided on a panel board 3.

The display unit 31 is a liquid crystal panel constituting a screen that includes pixels arranged in a matrix form. Then, the display unit 31 displays an image by the system drivers 35. Here, as a TFT that is a switching element included in the display unit 31, similarly to Embodiment 1 described above, a TFT using an oxide semiconductor as a semiconductor layer is adopted. An example of the oxide semiconductor includes IGZO (InGaZnOx: registered trademark) that is an In—Ga—Zn—O-based oxide semiconductor.

Each of the system drivers 35 is a source driver incorporating a ICON function. Specifically, the system driver 35 includes the data reception unit 22, a memory unit 27, and a panel control unit 28.

Similarly to Embodiment 1 described above, the data reception unit 22 receives display data generated by the display data generation unit 201 via the eDP interface, and shifts the panel control unit 28 to the High level at a timing of the reception and transmits the received display data to the memory unit 27.

The memory unit 27 is constituted by a line buffer. Note that, in the present embodiment, an example in which the memory unit 27 is constituted by a line buffer will be described, but the memory unit 27 is not limited thereto and may be constituted by a frame buffer.

The panel control unit 28 includes a source driver block functioning as a source driver and a gate driver block functioning as a gate driver by which the display unit 31 is driven. Here, similarly to the source driver 12 in Embodiments 1 and 2 described above, the source driver block also requires a time to be shifted from the sleep state to the active state. Accordingly, also in the present embodiment, similarly to Embodiments 1 and 2 described above, it is necessary to delay the display data supplied to the panel control unit 28. The delay of the display data is performed in the memory unit 27 described above.

Since the memory unit 27 is a line buffer, processing of delaying display data is similar to that of Embodiment 1 described above.

That is, as illustrated in FIG. 9, in the liquid crystal module 103, in synchronization with an input of display data from the display data generation unit 201 to a system driver 35, the source driver block in the panel control unit 28 in the system driver 35 starts to be shifted to the active state. On the other hand, the display data input to the system driver 35 for a preset number of lines is accumulated by the memory unit 27, and then transmitted to the panel control unit 28. Thereby, the display data is transmitted to the source driver block after being delayed by the preset number of lines from the time when the source driver block in the panel control unit 28 starts to be shifted to the active state.

Also in the present embodiment, similarly to Embodiment 1 described above, the number of lines of the display data to be accumulated in the memory unit 27 may be set to a number allowing delay by a time corresponding to a recovery time of the source driver block. Since the recovery time of the source driver block is a time that is able to be known in advance, the number of lines of display data to be accumulated in the memory unit 27 may be set in accordance with the source driver block that is used.

Example

Figure 10:
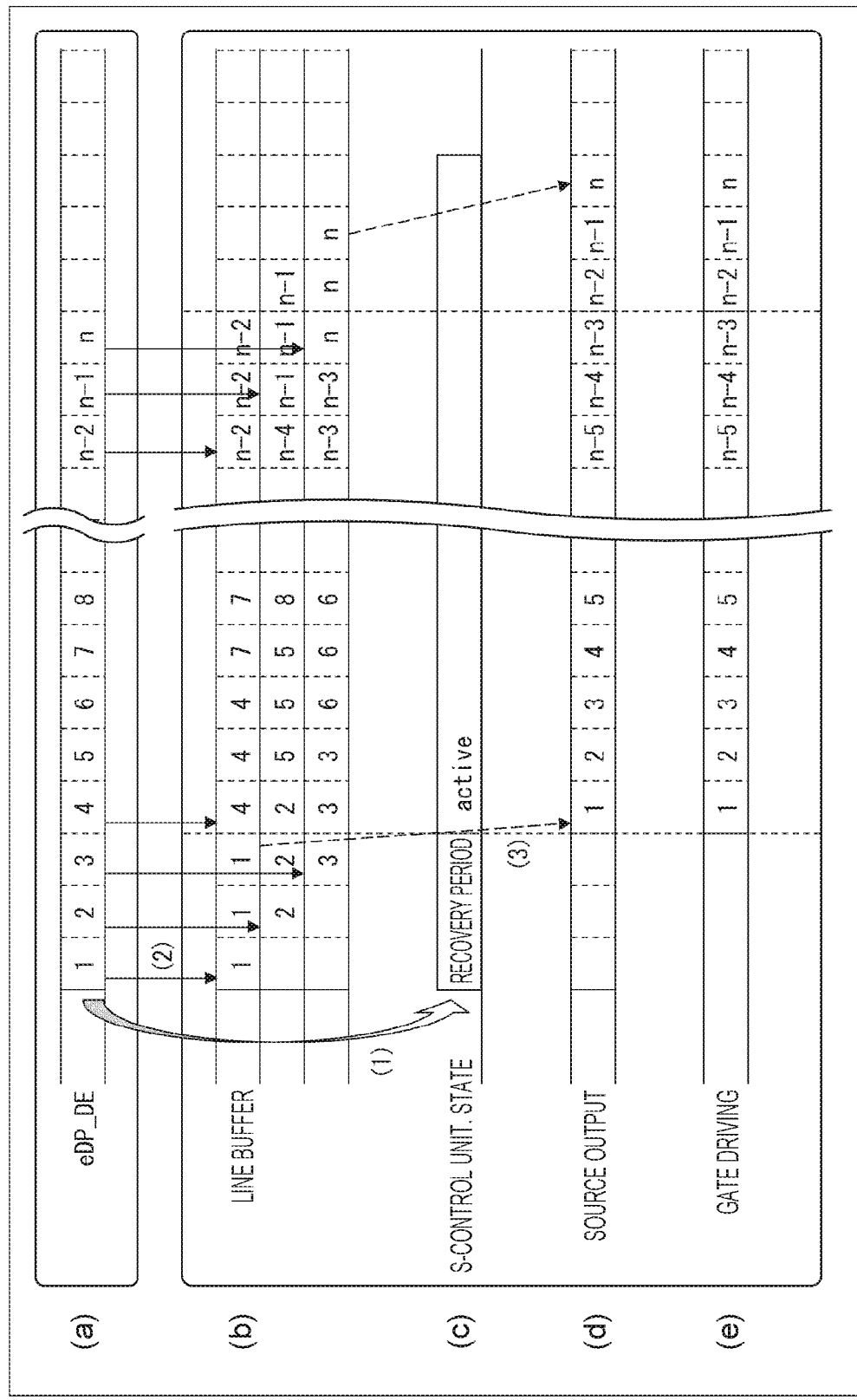
FIG. 10 is a timing chart for explaining a method for driving the liquid crystal module illustrated in FIG. 9.

FIG. 10 is a timing chart for explaining a driving method in which the number of lines of display data to be accumulated in the memory unit 27 is set to 3. The timing chart illustrated in FIG. 10 is almost the same as the timing chart illustrated in FIG. 3 of Embodiment 1 described above, and a difference lies in that the timing chart of FIG. 3(c) which indicates the state of the terminal A 23 and the timing chart of FIG. 3(e) which indicates the state of the source driver are summarized in a state (S-control unit. state) of the source driver block in the panel control unit 28 which is in FIG. 10(c).

However, the driving method is almost the same as that of Embodiment 1 described above.

That is, as illustrated in FIG. 10, (1) in the pause period, in synchronization with an input of display data (eDP_DE) from the display data generation unit 201 to the system driver 35, the source driver block in the panel control unit 28 starts to be shifted to the active state.

(2) When the display data (eDP_DE) from the display data generation unit 201 is input to the system driver 35, the display data for three lines is stored in the memory unit 27.

(3) At a timing when the display data for the three lines is stored in the memory unit 27, the state (S-control unit. State) of the source driver block in the panel control unit 28 is completely recovered so as to be the active state, and the display data is transmitted to the source driver block. The source driver block outputs the transmitted display data to the display unit 31. Gate driving also starts in synchronization with an output operation of the source driver block.

Note that, similarly to Embodiment 1 described above, while the transmission of the display data is delayed for the number or more of lines, the active period of the source driver block in the panel control unit 28 is extended.

Moreover, in order to secure a recovery time taken for the source driver block to be completely recovered after start of the recovery, the number of lines in the memory unit 27 may not be the same as the number of lines to be delayed. For example, only three may be delayed with respect to an 8-line buffer storing display data for eight lines.

According to the aforementioned driving method, the recovery of the source driver block of the panel control unit 28 in the system driver 35 starts at the timing when the display data is input to the system driver 35, and the display data is delayed so that the display data is input after the source driver block is completely recovered and the display data is output to the display unit 31.

In this manner, in the driving method according to the present embodiment, a signal (such as an MSA signal) by which a timing of outputting display data from the source driver block to the display unit 31 is adjusted is not required to be separately prepared.

Accordingly, since deviation of a display timing on the liquid crystal module 103 side does not occur, display quality is not deteriorated. Moreover, since the idle driving is performed in the liquid crystal module 103, reduction in power consumption is also achieved.

Modified Example

The invention does not require to separately prepare a signal, such as an MSA signal, which is conventionally required in the idle driving and by which a timing is adjusted. Thus, when the refresh rate of the liquid crystal module corresponds to an image generation speed of the CPU/GPU, the idle driving of the invention is applicable also to frequency-variable driving (such as Adaptive Sync. Hereinafter, described as Adaptive Sync as a representative) that reduces unsmooth display or tearing.

In general, in a case of the Adaptive Sync, at a point of one frame before a current frame, a timing when the CPU/GPU side ends image generation of the frame is unknown, so that a timing of outputting a first line of the current frame is not able to be transmitted to the liquid crystal module by using an MSA signal. Thus, until display data of the current frame is transmitted, the liquid crystal module side is not able to know the start of the frame. Accordingly, there is a case where, when display data is transmitted to a source driver, the source driver is not in the active state. Thus, deviation of a display timing occurs and display quality is considerably deteriorated.

However, as described in Embodiments 1 to 3 described above, as long as display data is delayed by considering a recovery time of the source driver, even in a case where the liquid crystal module side is not able to know start of a frame in such a case of the Adaptive Sync, display data is able to be transmitted all times when the source driver is in the active state, so that deviation of a display timing does not occur and deterioration of display quality is able to be suppressed.

Thereby, it is found that the driving method of the invention is suitable for the case where the idle driving is applied to the Adaptive Sync. Accordingly, an effect that deterioration of display quality due to unsmooth display or tearing is able to be suppressed by the Adaptive Sync, while reducing power consumption by the idle driving is exerted.

Here, in Embodiments 1 to 3 described above, as the TFT of the display units 11 or 31, the TFT using an oxide semiconductor as a semiconductor layer is adopted. Since the oxide semiconductor has high electron mobility, by adopting the TFT using an oxide semiconductor (e.g. the aforementioned TFT using an In—Ga—Zn—O-based oxide semiconductor) as a switching element of the display unit, it becomes possible to reduce a size of the switching element (TFT) and achieve high definition and a high aperture ratio of the display unit. Moreover, the TFT using an oxide semiconductor reduces leakage current and is thus advantageous to the idle driving, resulting that it is possible to achieve reduction in power consumption in the liquid crystal module. As above, an effect is exerted that, when the TFT using an oxide semiconductor as a semiconductor layer is adopted as the TFT of the display unit 11 or 31, it is extremely advantageous in achieving high definition, a high aperture ratio, and reduction in power consumption.

As the TFT of the display unit 11 or 31, the TFT using an oxide semiconductor as a semiconductor layer is suitable as described above, but a TFT using a-Si (amorphous silicon) as a semiconductor layer may be used in addition thereto.

Note that, though a case of idle driving when a non-scanning period is longer than a scanning period has been described so far, there is no limitation thereto, and the invention is able to be applied also to a case of idle driving when a scanning period is longer than a non-scanning period.

CONCLUSION

A method for driving a display device according to an aspect of the invention is a method for driving a display device (liquid crystal module 101, 102) that performs display by line-sequentially selecting and scanning each of lines of a screen, which includes pixels arranged in a matrix form, with a plurality of scanning signal lines and supplying a data signal to a pixel of the selected line from a data signal line, in which, in a case where, in one vertical period, a non-scanning period other than a scanning period in which the screen is scanned once is set to a pause period, by a recovery period during which a data signal line driving circuit (source driver 12) that drives the data signal line is recovered from a sleep state to an active state where the data signal is able to be supplied to the data signal line, supply of the data signal to the data signal line driving circuit (source driver 12) is delayed.

According to the aforementioned configuration, by delaying the supply of the data signal to the data signal line driving circuit, which drives the data signal line, by the recovery period during which the data signal line driving circuit is recovered from the sleep state to the active state where the data signal is able to be supplied to the data signal line, it is possible to supply the data signal to the data signal line at a timing when the data signal line driving circuit is recovered. In this manner, since it is only required to delay the supply of the data signal to the data signal line driving circuit, the supply of the data signal to the data signal line is able to be performed at an appropriate timing without timing information such as an MSA signal. That is, even in a case where the timing information is not transmitted to the data signal line driving circuit in advance, the idle driving is able to be appropriately performed.

Thereby, in both a case where an image generation speed of a CPU/GPU is constant and a refresh rate on a liquid crystal module side is fixed and a case where the image generation speed of the CPU/GPU varies depending on an image and the refresh rate (vertical period) on the liquid crystal module side is changed in accordance with the image generation speed, since the idle driving is able to be appropriately performed even when the timing information is not known in advance, deterioration of display quality is not caused.

In the method for driving the display device according to an aspect 2 of the invention, the one vertical period is preferably variable in accordance with a generation speed of the data signal, in the aspect 1.

According to the aforementioned configuration, by applying the idle driving of the aspect 1 to frequency-variable driving, such as Adaptive Sync, by which the one vertical period is variable in accordance with the generation speed of the data signal, even in a case where the generation speed of the data signal is changed, a display timing is not deviated, so that deterioration of display quality is not caused.

In the method for driving the display device according to an aspect 3 of the invention, the recovery period may correspond to a period in which the scanning signal lines for a preset number of lines are scanned, and the data signal may be supplied to the data signal line driving circuit by being delayed by the preset number of lines, in the aspect 1 or 2.

According to the aforementioned configuration, a delay amount is able to be easily set.

In the method for driving the display device according to an aspect 4 of the invention, in the recovery period, the data signal for the preset number of lines may be stored in a line buffer 24 and the data signal stored in the line buffer 24 may be supplied to the data signal line driving circuit (source driver 12) by being delayed by the preset number of lines, in the aspect 3.

According to the aforementioned configuration, by using the line buffer, the number of lines corresponding to the delay amount is able to be easily decided.

In the method for driving the display device according to an aspect 5 of the invention, in the recovery period, the data signal for one frame may be stored in a frame buffer 26 and the data signal stored in the frame buffer 26 may be supplied to the data signal line driving circuit (source driver 12) by being delayed by the preset number of lines, in the aspect 3.

According to the aforementioned configuration, since display data for one frame is once stored, it is not necessary to always rewrite data as in a case of a line buffer in which the number of lines that is able to be stored is decided.

A method for driving a display device according to an aspect 6 of the invention is a method for driving a display device (liquid crystal module 103) for display that includes a panel driving unit (panel control unit 28) driving a display panel (display unit 31) and performing display by line-sequentially selecting and scanning each of lines of a screen, which includes pixels arranged in a matrix form, with a plurality of scanning signal lines and by supplying a data signal to a pixel of the selected line from a data signal line, in which, in a case where, in one vertical period, a non-scanning period other than a scanning period in which the screen of the display panel (display unit 31) is scanned once is set to a pause period, by a recovery period during which the panel driving unit (panel control unit 28) is recovered, in the pause period, from a sleep state to an active state where the data signal is able to be supplied to the data signal line, supply of the data signal to the panel driving unit (panel control unit 28) is delayed.

According to the aforementioned configuration, by delaying the supply of the data signal to the panel driving unit, which drives the data signal line, by the recovery period during which the panel driving unit is recovered, in the pause period, from the sleep state to the active state where the data signal is able to be supplied to the data signal line, it is possible to supply the data signal to the data signal line at a timing when a driving circuit is recovered. In this manner, since it is only required to delay the supply of the data signal to the data signal line, the supply of the data signal to the data signal line is able to be performed at an appropriate timing without timing information such as an MSA signal. That is, even in a case where the timing information is not transmitted to the driving circuit in advance, the idle driving is able to be appropriately performed.

Thereby, in both a case where an image generation speed of a CPU/GPU is constant and a refresh rate on a liquid crystal module side is fixed and a case where the image generation speed of the CPU/GPU varies depending on an image and the refresh rate (vertical period) on the liquid crystal module side is changed in accordance with the image generation speed, the idle driving is able to be appropriately performed even when the timing information is not known in advance, deterioration of display quality is not caused.

In the method for driving the display device according to an aspect 7 of the invention, an oxide semiconductor may be used as a semiconductor layer of a TFT of each of the pixels of the display device (liquid crystal module 101, 102, 103), in any one of the aspects 1 to 6.

In the method for driving the display device according to an aspect 8 of the invention, the oxide semiconductor may be an In—Ga—Zn—O-based oxide semiconductor, in the aspect 7.

According to the aforementioned configuration, as the TFT of each of the plurality of pixels that constitute a display element, the TFT using the oxide semiconductor as the semiconductor layer is used, so that it becomes possible to reduce a size of the TFT and achieve high definition and a high aperture ratio of the display unit. Moreover, the TFT using the oxide semiconductor reduces leakage current and is thus advantageous to idle driving, resulting that it is possible to achieve reduction in power consumption in the display device.

A display device to which the driving method according to any one of the aspects 1 to 8 is applied exerts an effect of reducing power consumption and not causing deterioration of display quality.

The invention is not limited to each of the embodiments described above, and may be modified in various manners within the scope indicated in the claims and an embodiment achieved by appropriately combining technical means disclosed in different embodiments is also encompassed in the technical scope of the invention. Further, by combining the technical means disclosed in each of different embodiments, a new technical feature may be formed.

REFERENCE SIGNS LIST

1 panel board
2 control board
3 panel board
11 display unit (display panel)
12 source driver (data signal line driving circuit)
21 ICON circuit
22 data reception unit
23 terminal A
24 line buffer
25 data transmission unit
26 frame buffer
27 memory unit
28 panel control unit (panel driving unit)
31 display unit (display panel)
35 system driver
101 liquid crystal module (display device)
102 liquid crystal module (display device)
103 liquid crystal module (display device)
201 display data generation unit

The invention claimed is:

1. A method for driving a display device that performs display by line-sequentially selecting and scanning each of data signal lines of a screen, which includes pixels arranged in a matrix form, with a plurality of scanning signal lines and supplying a data signal to a pixel of the selected data signal lines from the data signal lines, wherein:
   in a case where, in one vertical period, a non-scanning period other than a scanning period in which the screen is scanned once is set to a pause period;
   in synchronization with an input of the data signal to the display device, a data signal line driving circuit that drives the data signal line starts to be recovered from a sleep state to an active state where the data signal is able to be supplied to the data signal line;
   a terminal of a timing controller is shifted to high level in synchronization with the input of the data signal;
   the data signal line driving circuit connected to the terminal starts to be shifted to the active state;
   by a recovery period during which the data signal line driving circuit that drives the data signal line is recovered from the sleep state to the active state where the data signal is able to be supplied to the data signal line, supply of the data signal to the data signal line driving circuit is delayed from the input of the data signal to the display device;
   an end of an active period of the data signal line driving circuit is delayed from an end of the input of the data signal by at least an amount of delay of the supply of the data signal;
   the recovery period corresponds to a period in which the scanning signal lines for a preset number of lines are scanned; and
   the data signal is supplied to the data signal line driving circuit by being delayed by the preset number of lines.

2. The driving method according to claim 1, wherein the one vertical period is variable in accordance with a generation speed of the data signal.

3. The driving method according to claim 1, wherein, in the recovery period, the data signal for the preset number of lines is stored in a line buffer and the data signal stored in the line buffer is supplied to the data signal line driving circuit by being delayed by the preset number of lines.

4. The driving method according to claim 1, wherein, in the recovery period, the data signal for one frame is stored in a frame buffer and the data signal stored in the frame buffer is supplied to the data signal line driving circuit by being delayed by the preset number of lines.

5. The driving method according to claim 1, wherein an oxide semiconductor is used as a semiconductor layer of a TFT of each of the pixels.

6. The driving method according to claim 5, wherein the oxide semiconductor is an In—Ga—Zn—O-based oxide semiconductor.

7. A display device that is driven by the driving method according to claim 1.

8. The driving method according to claim 1, wherein the data signal is supplied to the data signal line driving circuit subsequently to recovery of the data signal line driving circuit, by being delayed by the preset number of lines.

9. The driving method according to claim 1, wherein the data signal is supplied to the data signal line driving circuit simultaneously with recovery of the data signal line driving circuit, by being delayed by the preset number of lines.

10. A method for driving a display device for display that includes a panel driving unit driving a display panel and performing display by line-sequentially selecting and scanning each of data signal lines of a screen, which includes pixels arranged in a matrix form, with a plurality of scanning signal lines and by supplying a data signal to a pixel of the selected data signal lines from the data signal lines, wherein:
   in a case where, in one vertical period, a non-scanning period other than a scanning period in which the screen of the display panel is scanned once is set to a pause period;
   in synchronization with an input of the data signal to the display device, a data signal line driving circuit that drives the data signal line starts to be recovered from a sleep state to an active state where the data signal is able to be supplied to the data signal line;
   a terminal of a timing controller is shifted to high level in synchronization with the input of the data signal, and the data signal line driving circuit connected to the terminal starts to be shifted to the active state;
   by a recovery period during which the panel driving unit is recovered, in the pause period, from the sleep state to the active state where the data signal is able to be supplied to the data signal line, supply of the data signal to the panel driving unit is delayed from the input of the data signal to the display panel;
   an end of an active period of the panel driving unit is delayed from an end of the input of the data signal by at least an amount of delay of the supply of the data signal;
   the recovery period corresponds to a period in which the scanning signal lines for a preset number of lines are scanned; and
   the data signal is supplied to the data signal line driving circuit by being delayed by the preset number of lines.

11. The driving method according to claim 10, wherein an oxide semiconductor is used as a semiconductor layer of a TFT of each of the pixels.

12. The driving method according to claim 10, wherein the one vertical period is variable in accordance with a generation speed of the data signal.

13. The driving method according to claim 10, wherein, in the recovery period, the data signal for the preset number of lines is stored in a line buffer and the data signal stored in the line buffer is supplied to the panel driving unit by being delayed by the preset number of lines.

14. The driving method according to claim 10, wherein, in the recovery period, the data signal for one frame is stored in a frame buffer and the data signal stored in the frame buffer is supplied to the panel driving unit by being delayed by the preset number of lines.

15. A display device that is driven by the driving method according to claim 10.

16. The driving method according to claim 10, wherein the data signal is supplied to the panel driving unit subsequently to recovery of the panel driving unit, by being delayed by the preset number of lines.

17. The driving method according to claim 10, wherein the data signal is supplied to the panel driving unit simultaneously with recovery of the panel driving unit, by being delayed by the preset number of lines.

* * * * *